United States Patent
Ozluturk et al.

(10) Patent No.: US 7,257,379 B2
(45) Date of Patent: Aug. 14, 2007

(54) COMPENSATING FOR ANALOG RADIO COMPONENT IMPAIRMENTS TO RELAX SPECIFICATIONS

(75) Inventors: Fatih Ozluturk, Port Washington, NY (US); Leonid Kazakevich, Plainview, NY (US); Kenneth P. Kearney, Smithtown, NY (US); Geetha Lakshmi Narayan, Holbrook, NY (US); Alpaslan Demir, Commack, NY (US); Tanbir Haque, Long Island City, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 558 days.

(21) Appl. No.: 10/713,613

(22) Filed: Nov. 14, 2003

(65) Prior Publication Data

US 2004/0162104 A1  Aug. 19, 2004

Related U.S. Application Data

(60) Provisional application No. 60/427,126, filed on Nov. 15, 2002.

(51) Int. Cl.
*H04B 1/38* (2006.01)

(52) U.S. Cl. .......................... 455/73; 455/295; 455/296
(58) Field of Classification Search .................. 455/73, 455/80, 111, 283, 295, 296, 333; 375/219
See application file for complete search history.

(56) References Cited

U.S. PATENT DOCUMENTS

| | | | |
|---|---|---|---|
| 5,390,365 | A | 2/1995 | Enoki et al. |
| 5,828,955 | A | 10/1998 | Lipowski et al. |
| 5,960,339 | A | 9/1999 | Benveniste |
| 6,049,722 | A | 4/2000 | Umemoto et al. |
| 6,125,266 | A | 9/2000 | Matero et al. |
| 6,298,096 | B1 | 10/2001 | Burgin |
| 6,675,024 | B1 | 1/2004 | Loke et al. |
| 7,016,654 | B1 * | 3/2006 | Bugeja ........................ 455/73 |
| 2002/0018531 | A1 | 2/2002 | Ratto |

FOREIGN PATENT DOCUMENTS

| | | |
|---|---|---|
| EP | 0180339 | 5/1986 |
| KR | 1998-15798 | 5/1998 |

* cited by examiner

*Primary Examiner*—Lee Nguyen
(74) *Attorney, Agent, or Firm*—Volpe and Koenig, P.C.

(57) ABSTRACT

In order to compensate for performance degradation caused by inferior low-cost analog radio component tolerances of an analog radio, a future system architecture (FSA) wireless communication transceiver employs numerous digital signal processing (DSP) techniques to compensate for deficiencies of such analog components so that modern specifications may be relaxed. Automatic gain control (AGC) functions are provided in the digital domain, so as to provide enhanced phase and amplitude compensation, as well as many other radio frequency (RF) parameters.

3 Claims, 7 Drawing Sheets

COMPENSATING FOR ANALOG RADIO COMPONENT IMPAIRMENTS TO RELAX SPECIFICATIONS

CROSS REFERENCE TO RELATED APPLICATION(S)

This application claims priority from U.S. provisional application No. 60/427,126, filed Nov. 15, 2002, which is incorporated by reference as if fully set forth.

FIELD OF THE INVENTION

The present invention generally relates to wireless communication systems. More particularly, the present invention relates to digital signal processing (DSP) techniques used to compensate for the impairments introduced in the radio, i.e., filter distortions, phase and amplitude imbalance, power distortions, etc., and variations in the dynamic range of the received signal due to changes in signal strength and channel loss.

BACKGROUND

Existing wireless system architectural configurations impose stringent constraints on the system designer with regards to receiving and transmitting communication signals. Moreover, such configurations often provide low reliability communication links, high operating costs, and an undesirably low level of integration with other system components.

In the radio frequency (RF) section of a conventional low-cost wireless transceiver configured with analog components, a considerable level of distortion occurs when RF signals are processed. Such distortions include filter amplitude and phase nonlinearities, phase and amplitude imbalance, power amplifier nonlinearities, carrier leakage or the like. Higher cost components with better distortion characteristics that enhance signal quality may be overlooked during the design phase in order to reduce the cost of the end-product.

In addition, variations in the channel loss and dynamic range of incoming signals of a wireless communication system must be compensated for in an efficient manner without subjecting the signals to undue distortion or interference.

Because the costs of components that process RF analog signals are higher than the components that use (DSP), it is desired to provide a digital baseband (DBB) system, including a low cost receiver and transmitter with low noise and minimal power requirements, that utilizes DSP techniques as much as is practicable.

SUMMARY

In order to compensate for performance degradation caused by inferior low-cost analog radio component tolerances of an analog radio, a future system architecture (FSA) wireless communication transceiver employs numerous DSP techniques to compensate for deficiencies of such analog components so that modern specifications may be relaxed. Automatic gain control (AGC) functions are provided in the digital domain, so as to provide enhanced phase and amplitude compensation, as well as many other RF parameters.

BRIEF DESCRIPTION OF THE DRAWINGS

A more detailed understanding of the invention may be had from the following description of a preferred example, given by way of example and to be understood in conjunction with the accompanying drawing wherein.

DETAILED DESCRIPTION OF THE PREFERRED EMBODIMENTS

Described hereinafter is an exemplary embodiment of the inventive future system architecture (FSA). FSA is a framework architecture for the physical layer and RF implementation platforms. FSA enables high performance solutions to be shifted from RF to digital baseband by using low performance radio components and compensating in the DBB for the lower radio performance. Thus, FSA promotes lower cost, lower power consumption and lower hardware complexity. By providing cross optimization between the radio and the DBB, the performance compensation in DBB is tied to the characteristics of the radio that the DBB is integrated with.

Preferably, the FSA transceiver disclosed herein is incorporated into a wireless transmit/receive unit (WTRU). Hereafter, a WTRU includes but is not limited to a user equipment, mobile station, fixed or mobile subscriber unit, pager, or any other type of device capable of operating in a wireless environment. The features of the FSA transceiver may be incorporated into an integrated circuit (IC) or be configured in a circuit comprising a multitude of interconnecting components.

Figure 1:
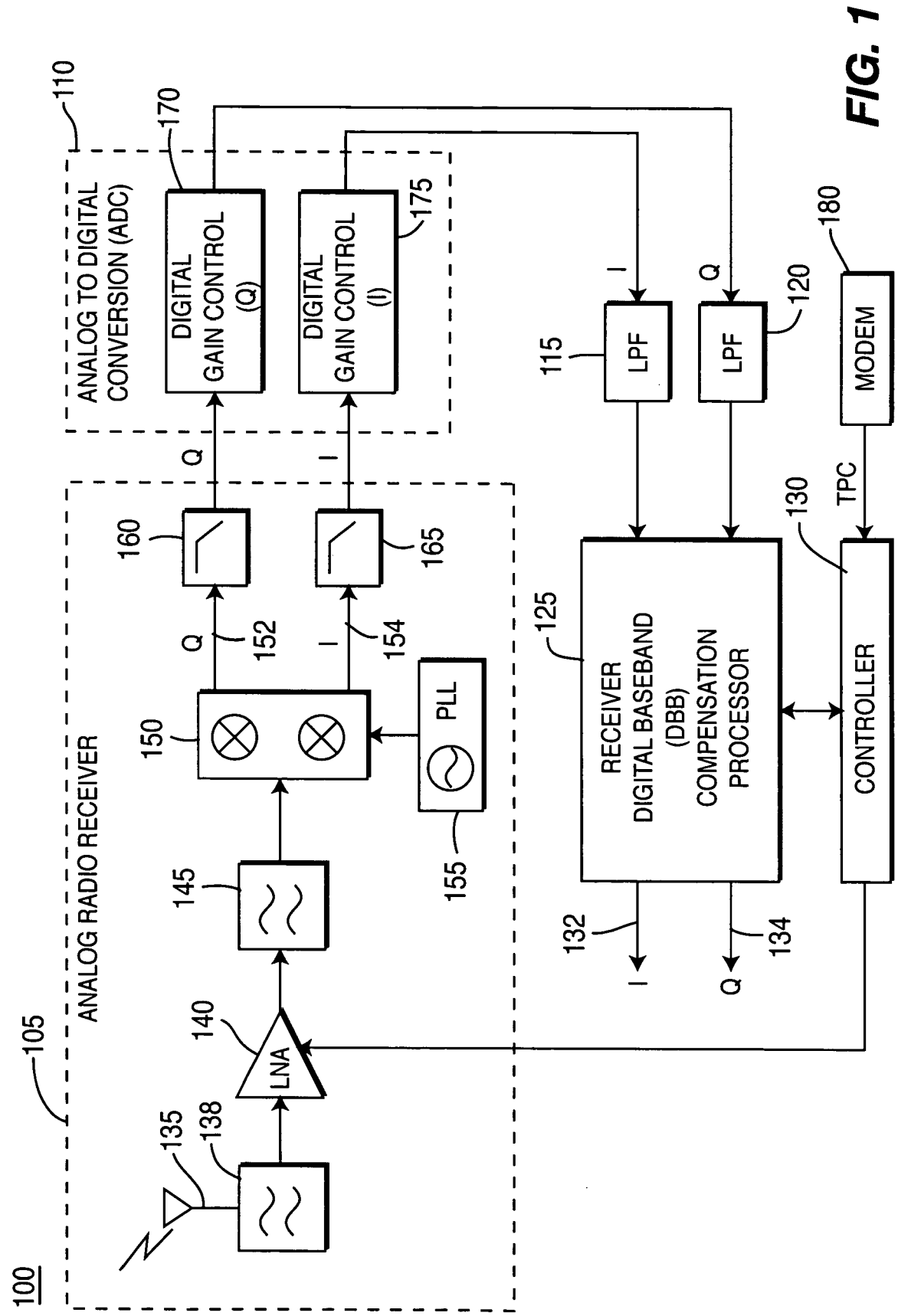
FIG. 1 is a block diagram of the receiver side of an FSA transceiver operating in accordance with the present invention.

FIG. 1 is a block diagram of an FSA receiver subsystem 100 of the FSA transceiver. The FSA receiver subsystem 100 includes an analog radio receiver 105, analog to digital conversion (ADC) circuit 110, low pass filters (LPFs) 115, 120, receiver DBB compensation processor 125 and controller 130. The FSA receiver system provides in-phase (I) and quadrature (Q) outputs 132, 134 after being processed by the receiver DBB compensation processor 125, which are of a higher quality than the quality that analog radio receiver 105 could provide by itself.

Controller 130 maintains control over all of the active components of analog radio receiver 105, ADC circuit 110, LPFs 115, 120 and the receiver DBB compensation processor 125. LPFs 115, 120 may be root-raised cosine (RRC) filters or other suitable filters. Furthermore, controller 130 has access to transmit power control (TPC) signals received from a base station or other entity via modem 180, whereby calculations or other functions performed by the controller 130 may depend. Controller 130 also communicates with a modem 180 and responds to transmit power control (TPC) signals.

As shown in FIG. 1, analog radio receiver 105 is a conventional direct conversion (DC) receiver which includes an antenna 135 for receiving wireless signals, a bandpass filter 138, a low noise amplifier (LNA) 140, an optional second filter 145 (e.g., bandpass filter), a demodulator 150 having two outputs 152, 154, a phase-locked loop (PLL) 155 and low pass filters (LPFs) 160, 165 for controlling bandwidth selectivity. The PLL generates a local oscillator signal to control the two outputs demodulator 150. Output 152 is a quadrature (Q) output of demodulator 150 and output 154 is an in-phase (I) output of demodulator 150.

The ADC circuit 110 is connected to the Q and I outputs 152, 154 via LPFs 160, 165. In accordance with the present invention, the analog radio receiver 105 is introduced to a digital domain established to enhance the performance characteristics of the analog radio receiver 105. The ADC circuit 110 includes two digital gain control circuits 170, 175.

Figure 2:
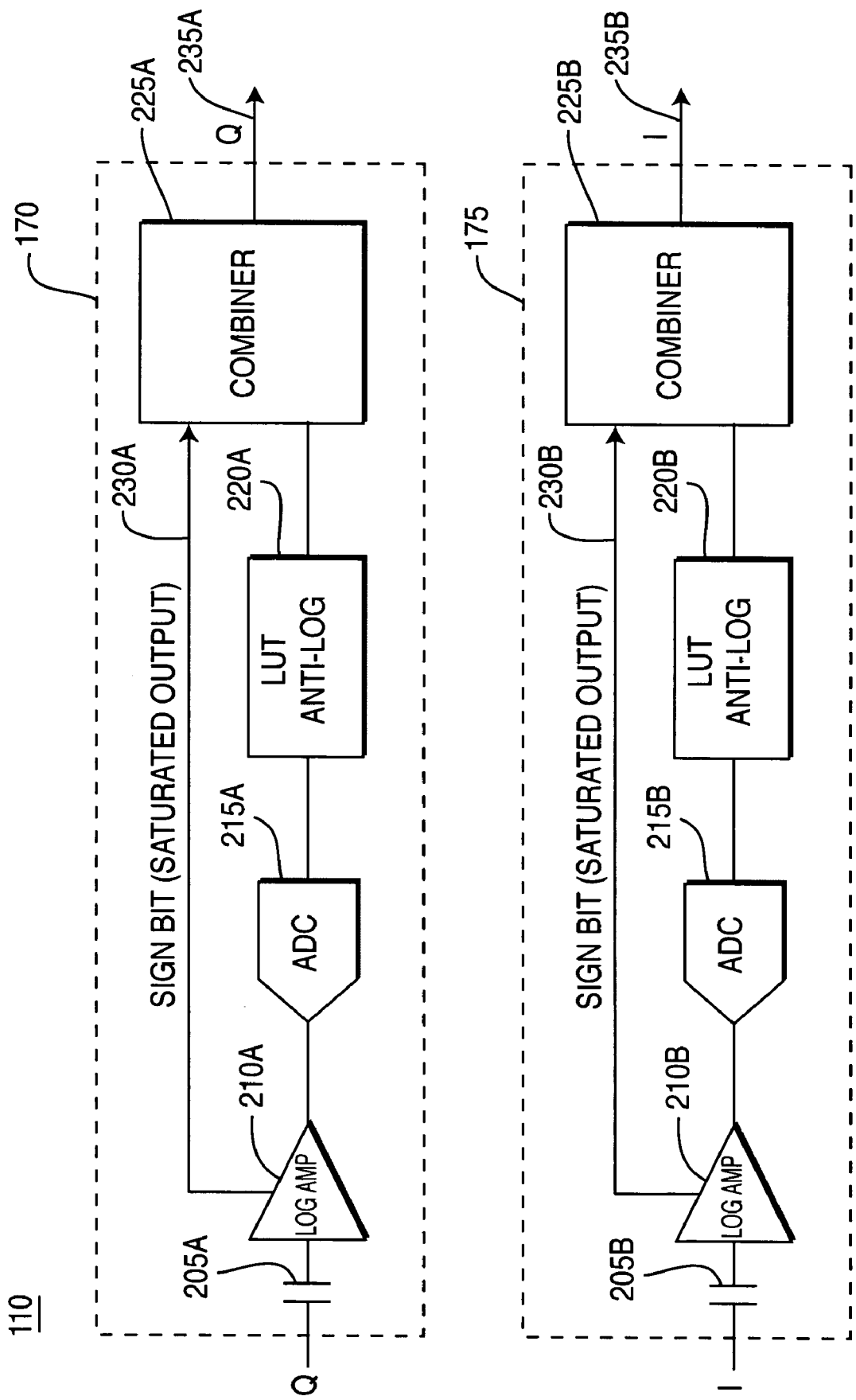
FIG. 2 is a detailed schematic of the analog to digital conversion (ADC) circuit of FIG. 1.

Referring to FIG. 2, each of digital gain control circuits 170, 175 include a logarithmic amplifier or other amplifier with known compression characteristics 210A, 210B for compressing the input analog signals received from analog radio receiver 105 from a wider dynamic range to a lower dynamic range. In other words, the logarithmic amplifiers 210A, 210B apply a particular level of amplification to the input analog signals in accordance with their amplitude. Digital gain control circuits 170, 175 further include a capacitor 205A, 205B, ADC 215A, 215B, look up table (LUT) 220A, 220B and combiner 225A, 225B. The LUTs 220A, 220B provide an anti-log function used to decompress the converted digital signals. Capacitors 205A, 205B carry out the function of a LPF for the purpose of eliminating direct current coupling. From the analog domain, the compression curve of the analog radio receiver is captured for future reference. ADCs 215A, 215B digitize the outputs of logarithmic amplifiers 210A, 210B and provide the digitized outputs to LUTs or anti-log functions 220A, 220B in order to decipher the digital domain of the I and Q signals. The outputs of the ADCs 215A, 215B are converted to a linear scale by generating (2*n−1) bit signals. It may be necessary to add one or more additional gain stages before each logarithmic amplifier 210A, 210B if the existing gain is not sufficient to promote saturation. The combiners 225A, 225B combine the digitized outputs of LUTs 220A, 220B with sign bits 220A, 220B provided by saturated outputs of the logarithmic amplifiers 210A, 210B, to generate digital Q and I outputs 235A, 235B, respectively. The sign bits 220A, 220B are created from saturated outputs of logarithmic amplifiers 210A, 210B, respectively.

Digital gain control circuits 170, 175 are used to compensate for channel loss variation and to support a large dynamic range of incoming signals (e.g., from 100 dBm to −20 dBm). Digital gain control circuits 170, 175 are also used to minimize the number of bits required for operating the ADCs 215A, 215B and are designed to efficiently compensate for channel loss variation in an expeditious manner, without distorting the signal envelope. Digital gain control circuits 170, 175 have a linear response, in dB-per-volt, and in a closed loop system is used to maintain functions such as stability, settling time, overshoot, etc.

Figure 3:
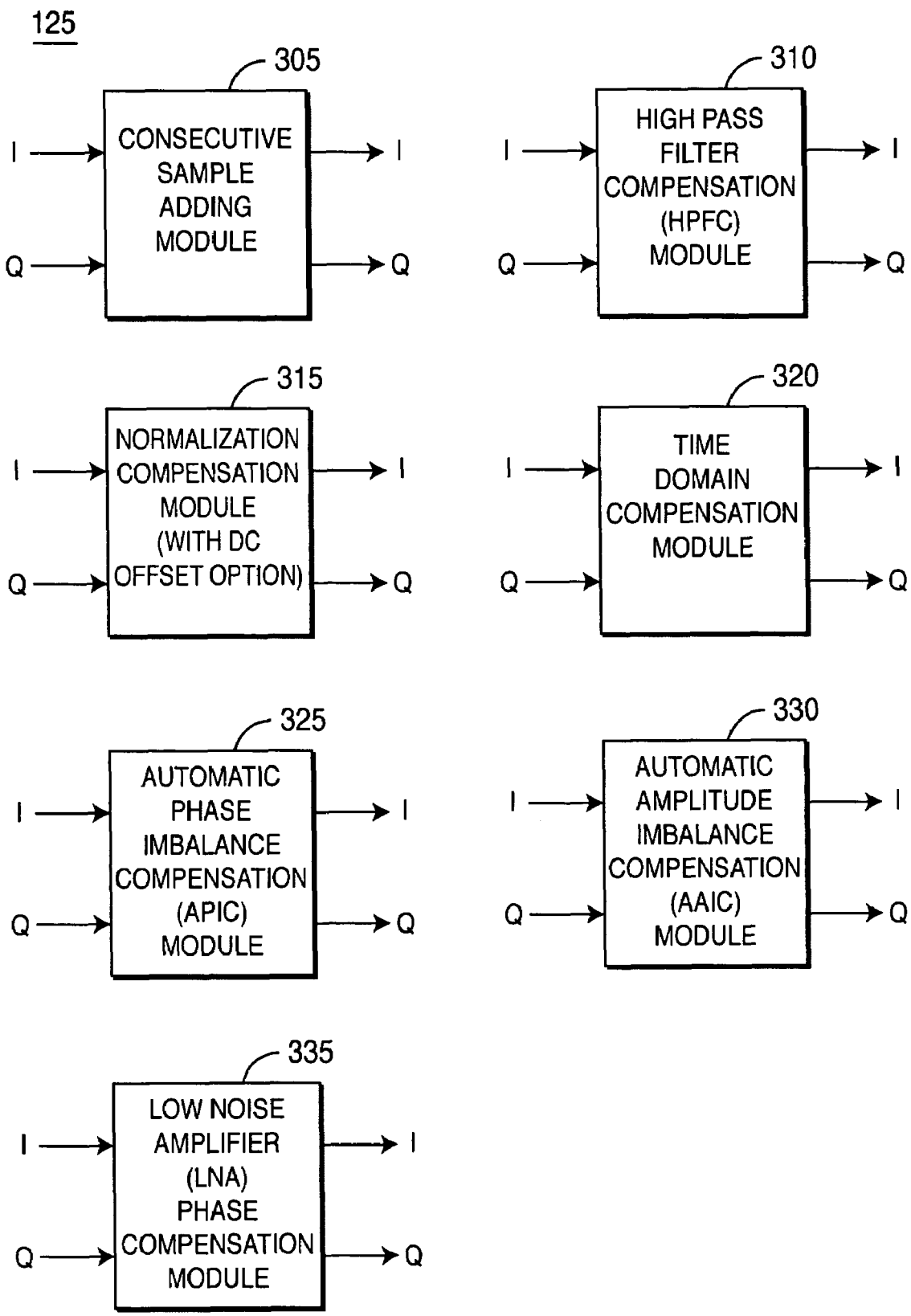
FIG. 3 shows the individual digital processing modules that are included in the receiver DBB compensation processor of FIG. 1.

Referring to FIG. 3, receiver DBB compensation processor 125 is used to enhance the RF performance of the analog radio receiver 105. The receiver DBB compensation processor 125 may be implemented using hardware, a powerful digital signal processor (DSP) and/or software. The receiver DBB compensation processor 125 includes:

1) Consecutive sample adding module 305;
2) High pass filter compensation (HPFC) module 310;
3) Normalization compensation module 315 with optional DC offset functionality;
4) Time domain compensation module 320;
5) Automatic phase imbalance compensation (APIC) module 325;
6) Automatic amplitude imbalance compensation (AAIC) module 330; and
7) Low noise amplifier (LNA) phase compensation module 335.

The receiver DBB compensation processor 125 is used to relax RF requirements of the components in the analog radio receiver 105, and reduce the cost and power consumption of the components used. Impairments due to RF component tolerances are corrected by using all digital gain control (ADGC) components without a need for adjusting any of the components in analog radio receiver 105.

Consecutive sample adding module 305 is used to adjust the bandwidth sampling rate of signals, e.g., 3.84 MHz, received by the analog radio receiver 105. The consecutive sample adding module 305 generates an internal clock that corresponds to the received signals, e.g., 3,840,000 times per second. The requirements for the analog radio receiver 105 to sample signals at chip rate, e.g., 3.84 million chips per second. The consecutive sample adding module 305 uses a processing speed that is at a much higher rate than the chip rate, (e.g., 10 times the chip rate), to sample the signals received by analog radio receiver 105. Consecutive samples are added on top of each other and a single output is generated, the sampling rate is effectively cut in half, (e.g., five times the chip rate). Thus, the consecutive sample adding module 305 reduces the sampling rate. Furthermore, the additional two consecutive samples will act as a low pass filter and will provide some selectivity performance on the outer bands of the received signals, allowing the specifications of LPFs 160, 165 to be relaxed. Other modules that follow the consecutive sample adding module 305 will also benefit since they will also be able to operate at the reduced sampling rate.

The HPFC module 310 is used to compensate for deficiencies in gain of the analog radio receiver 105 whereby consecutive amplifier stages are used to convert received signals from a high frequency to a baseband frequency (e.g., 5 MHz). Direct current (DC) components created from each amplifier stage must be canceled or else the output of the amplifier stages will become saturated. HPF stages are inserted between the amplifier stages in order to allow only AC components to be passed and the DC components to be suppressed. This causes the low pass section of the input signal to be altered. Unfortunately, this causes useful low frequency components to be suppressed. For example, error magnitude measurements (EVM) received in the incoming signals may be suppressed, thus causing impairment of the analog radio receiver 105. The HPFC module 310 simulates a reduction in the number poles of the HPF stages (e.g., from 50 KHz to 10 KHz) such that the frequency response of the HPF stages is corrected.

The normalization compensation module 315 (with optional DC offset functionality) is used to keep the output power of FSA receiver subsystem 100 constant (i.e., normalized) irrespective of the level of the input power received at antenna 135 of the analog radio receiver 105. The I and Q signal outputs are normalized using the average power of the I and Q channel outputs combined over n number of samples. Optionally, direct current (DC) component variations between the I and Q outputs causes the dynamic range of the FSA receiver subsystem 100 to be reduced using a DC offset function of the normalization compensation module 315. The DC offset function essentially provides DC cancellation on each of the I and Q outputs.

The normalization compensation module 315 also estimates the input power level of signals received by analog radio receiver 105 and turns on or off the LNA 140, depending on whether the estimated input power level falls below a predetermined power level threshold. A slot timing signal may be provided from the modem 180 to the normalization compensation module 315, via the controller 130, to aid the normalization process.

Time domain compensation module 320 is used to compensate for deficiencies in the design of LPFs 160, 165 of analog radio receiver 105, such as group delay variation which tracks phase variation over frequency.

The APIC module 325 is used to compensate for deficiencies in the design of demodulator 150 of analog receiver 105, whereby phase imbalances exist between the I and Q outputs 154 and 152. If the I and Q outputs are orthogonal to each other where the real and imaginary parts have a phase difference of 90 degrees, then the average (mean) value of the product of the I and Q signals for each sample over a particular period of time should be zero, as indicated by an internal error signal. If the phase difference between the I and Q signals is not orthogonal, the error signal is not equal to zero, e.g., the error signal is positive for a phase greater than ninety degrees and negative for a phase difference less than ninety degrees. A negative feedback loop within the APIC module 325 is used to adjust the phase of the I and Q signals, thus causing the error signal to return to zero indicating that the I and Q signals are orthogonal.

The AAIC module 330 is used to compensate for deficiencies in the design of demodulator 150 of analog receiver 105, whereby amplitude imbalances (e.g., instantaneous power differences) exist between the I and Q outputs 152 and 154. If the magnitude of signals on the I and Q outputs 152 and 154 are not the same, a gain factor is applied to one of the signals such that the magnitude of the I signal is equal to the magnitude to the Q signal. The magnitude of the difference between imbalances of the I and Q signals is determined by taking the absolute value of I and the absolute value of Q and subtracting one from the other. Gain adjustments are then made so that an error signal generated within the AAIC module 330 becomes zero, again with the use of a negative feedback loop. Thus, the amplitudes of I and Q signals are balanced.

The LNA phase compensation module 335 is used to adjust the phase insertion due to the switching of LNA 140 so that the modem 180 receives a seamless data stream.

Figure 4:
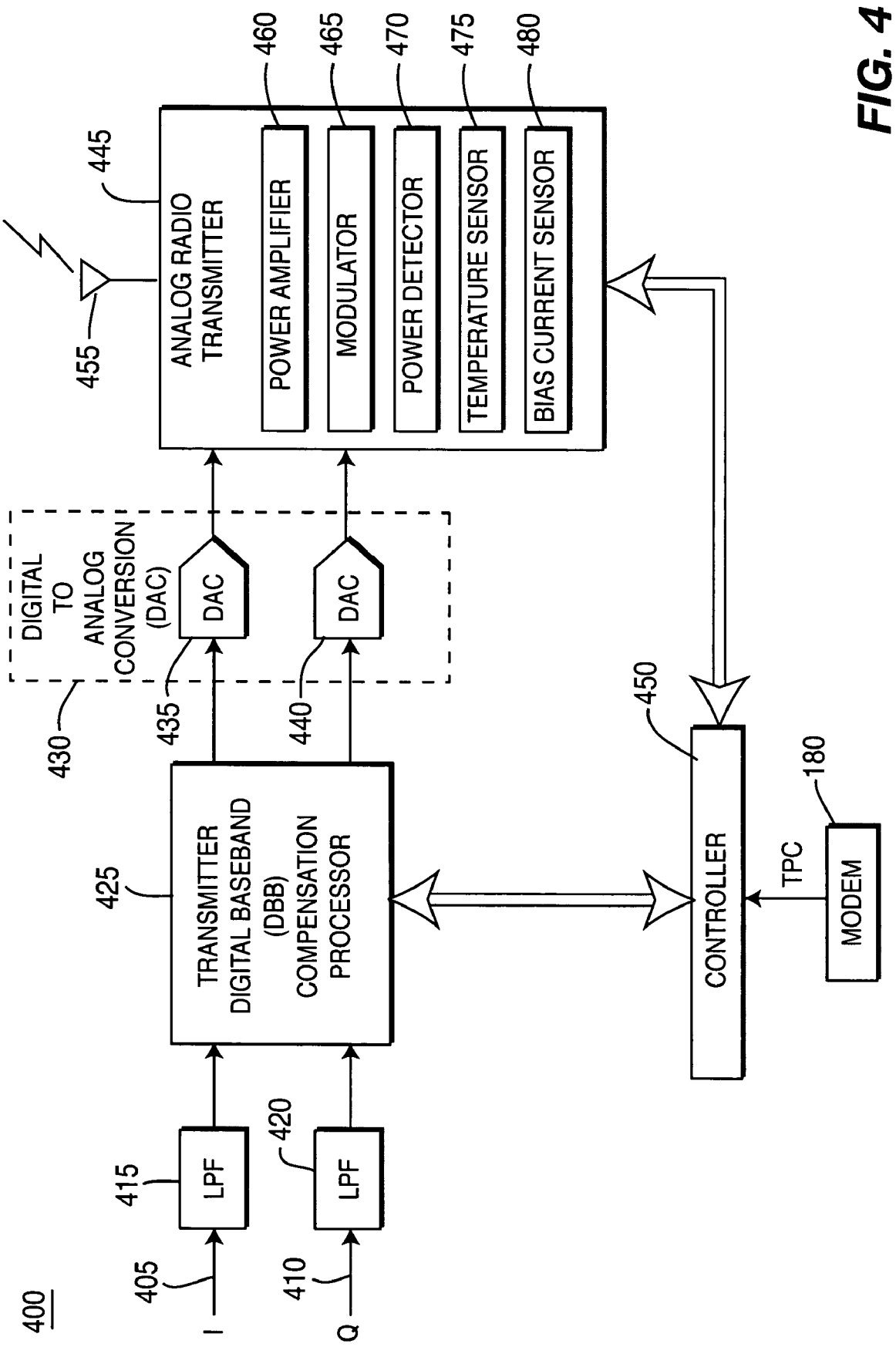
FIG. 4 is a block diagram of the transmitter side of the FSA transceiver operating in accordance with the present invention.

FIG. 4 is a block diagram of an FSA transmitter subsystem 400 of the FSA transceiver. The FSA transmitter subsystem 400 receives digital signals including I and Q components (on its modem side) via inputs 405, 410, passes the signals via LPFs 415, 420 and transmitter DBB compensation processor 425, applies digital to analog conversion (DAC) circuit 430, and applies the analog signals to analog radio transmitter 445. DAC circuit 430 includes DACs 435 and 440. FSA transmitter system 400 further includes a controller 450 which maintains control over the LPFs 415, 420, transmitter DBB processor 425, the DAC circuit 430 and all of the active components of the analog radio transmitter 445. Furthermore, controller 450 has access to TPC signals received by the modem 180 from a base station or other entity, whereby calculations or other functions performed by the controller 450 may depend. Analog radio transmitter 445 includes an antenna 455, power amplifier 460, modulator 465, power detector 470, temperature sensor 475 and bias current sensor 480. The components in the analog radio transmitter consist of low cost (i.e., "low-end" quality) components having "relaxed" specifications. For example, the specifications for the power amplifier need not be stringent because of the availability of a pre-distortion compensation module in the transmitter DBB compensation processor 425.

Figure 5:
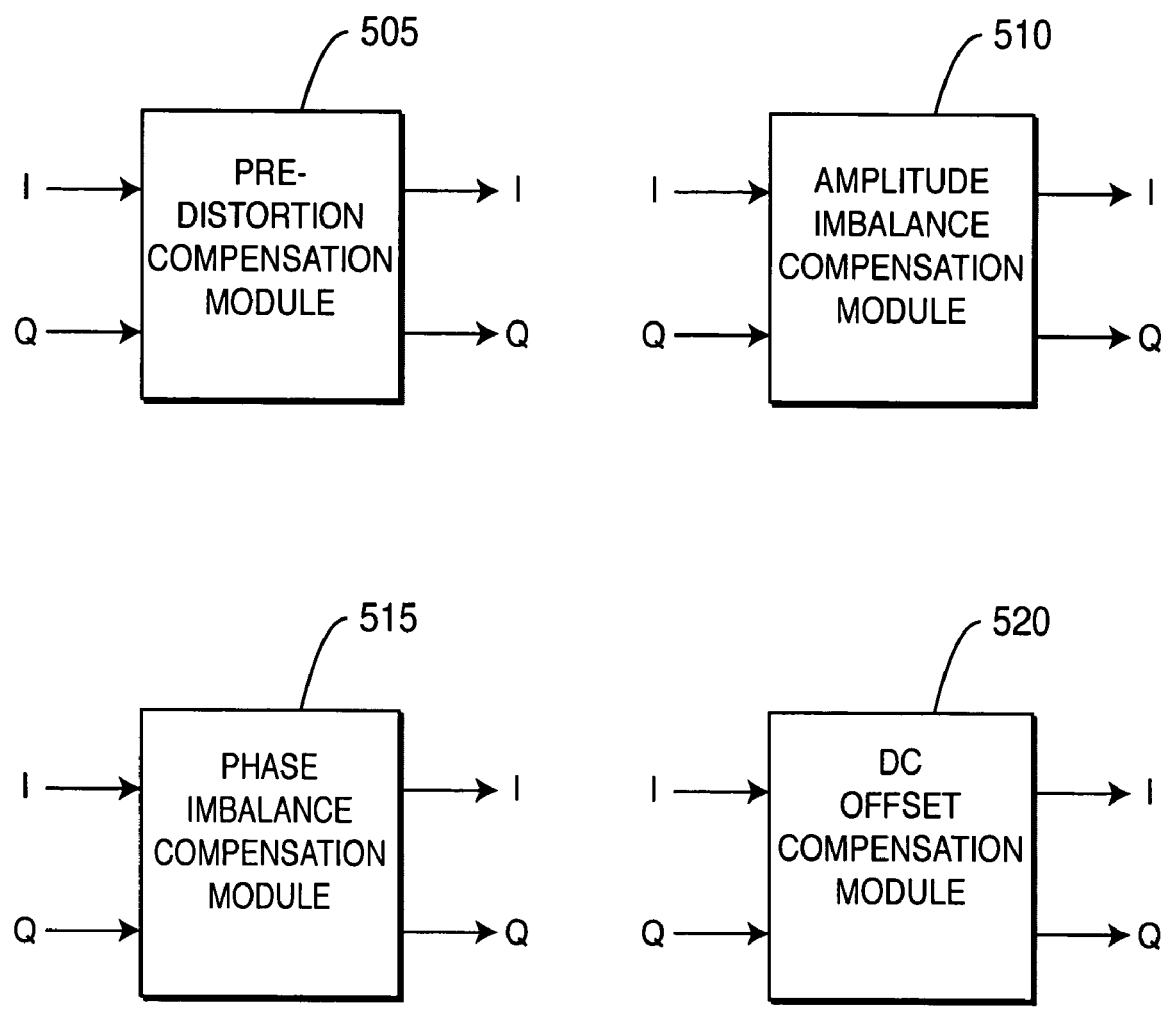
FIG. 5 shows the individual digital processing modules that are included in the transmitter DBB compensation processor of FIG. 4.

Referring to FIG. 5, transmitter DBB compensation processor 425 includes one or more of the following modules used to enhance the performance of analog radio transmitter 345:

1) Pre-distortion compensation module 505;
2) Amplitude imbalance compensation module 510;
3) Phase imbalance compensation module 515; and
4) DC offset compensation module 520.

The pre-distortion compensation module 505 is used to correct transmission amplitude characteristics, such as amplitude modulation (AM) to phase modulation (PM) and PM to AM signal characteristics. The amplitude and phase characteristics of the power amplifier 460 in the analog radio transmitter 445 are determined. The pre-distortion compensation module 505 then looks at the input power level. Based on known gain and phase characteristics of the power amplifier 460, the pre-distortion compensation module 505 purposely distorts the phase and amplitude of the I and Q signals such that the power amplifier generates a linear response, rather than a distorted response. The pre-distortion compensation module 505 may refer to an LUT or the like to obtain such amplifier characteristics. The advantages of this embodiment of the present invention is that standards for parameters such as intermodulation distortion may be met, even though cheap and low quality components (e.g., an amplifier having a low output power rating) are used in the analog radio transmitter 445.

Amplitude imbalance compensation module 510 is used to level the signal inputs I and Q such that the modulator 465 in the analog radio transmitter 445 modulates the signal inputs I and Q with equal power levels. Assuming that the modulator 465 is cheap and of low quality, the modulator 465 is probably prone to amplitude and phase imbalance problems. For example, if the I input is 1 dB above the Q signal, the module 510 will cause the I signal power level to be sent at an amplitude 1 dB lower. Thus, at the output of modulator 465, I and Q will be at the same amplitude. Using controller 450, I and Q may be turned on and off on an individual basis. For example, if controller 450 turns off the Q component, whereby only the I component is sent, the controller can determine what power level the power detector 470 in analog radio transmitter 445 is reading. Assuming that the power level is a desired target level, the I component is then turned off and the Q component is turned back on. The amplitude imbalance compensation module 510 adjusts the power level of Q such that the power detector reads the same power level as for signal component I.

Phase imbalance compensation module 515 is used to adjust the phase of signal inputs I and Q. The power level of the I and Q signal inputs is reduced by 3 dB. It is desired for the I and Q signal outputs to be orthogonal where the real and imaginary parts have a phase difference of 90 degrees to each other, as indicated by a 3 db increase in power when I and Q are sent together. Based on power level readings performed by the power detector 470 of analog radio transmitter 445, a phase difference of less than 90 degrees between I and Q will cause the power detector to read a power level greater than the target power level. A phase imbalance of greater than 90 degrees of I and Q will cause the power detector to read a power level less than the target power.

DC offset compensation module 520 is used to correct DC problems associated with the modulator 465 in analog radio transmitter 445. The DC level output from the modulator is corrected by shutting off the I and Q inputs such that their outputs are zero. The DC-offset values for I and Q are determined by sweeping the DC for I and Q sequentially while observing the measured minimum detector reading for future reference.

Figure 6:
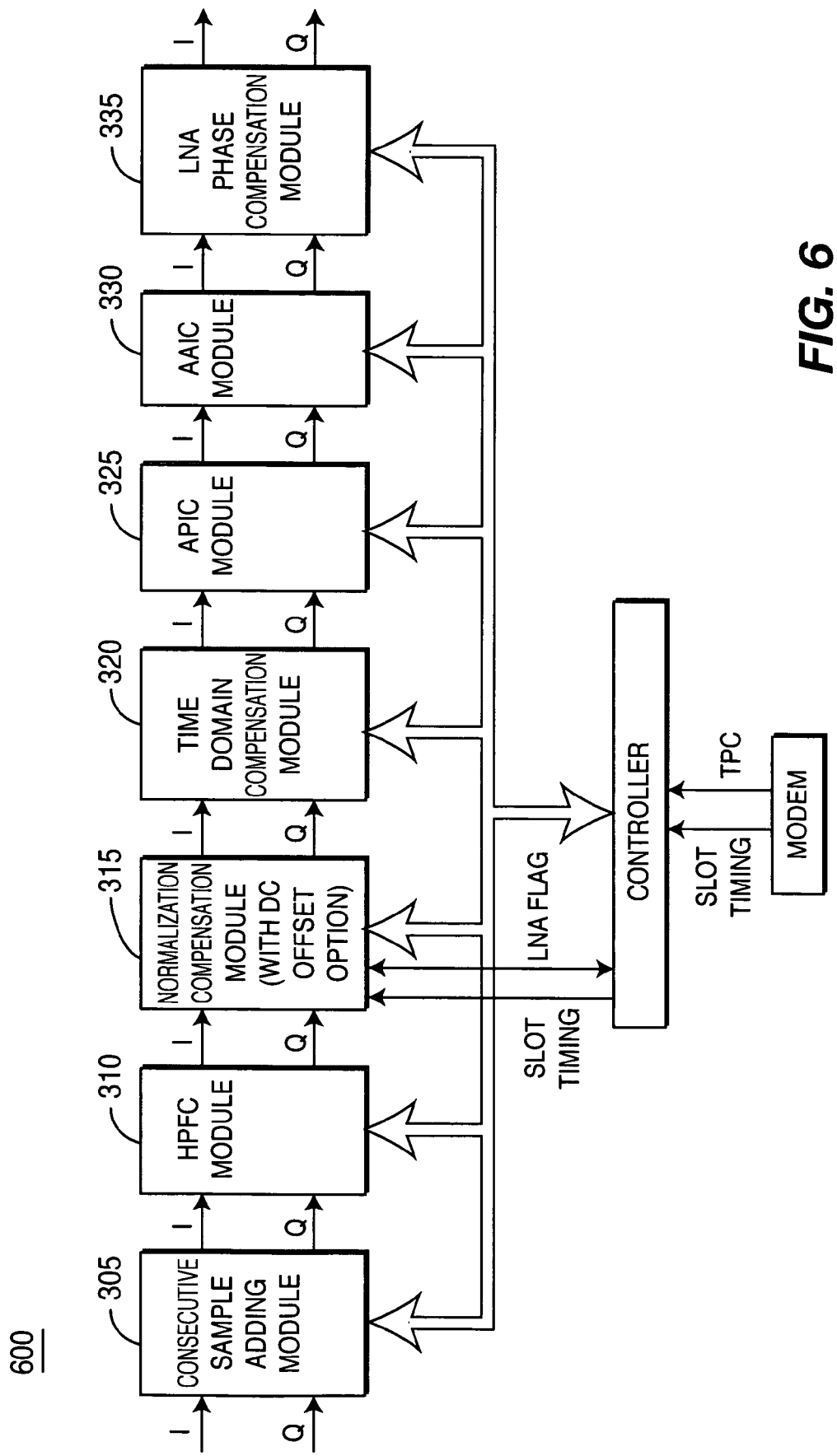
FIG. 6 shows a preferred configuration of the receiver DBB compensation modules of FIG. 3.
Figure 7:
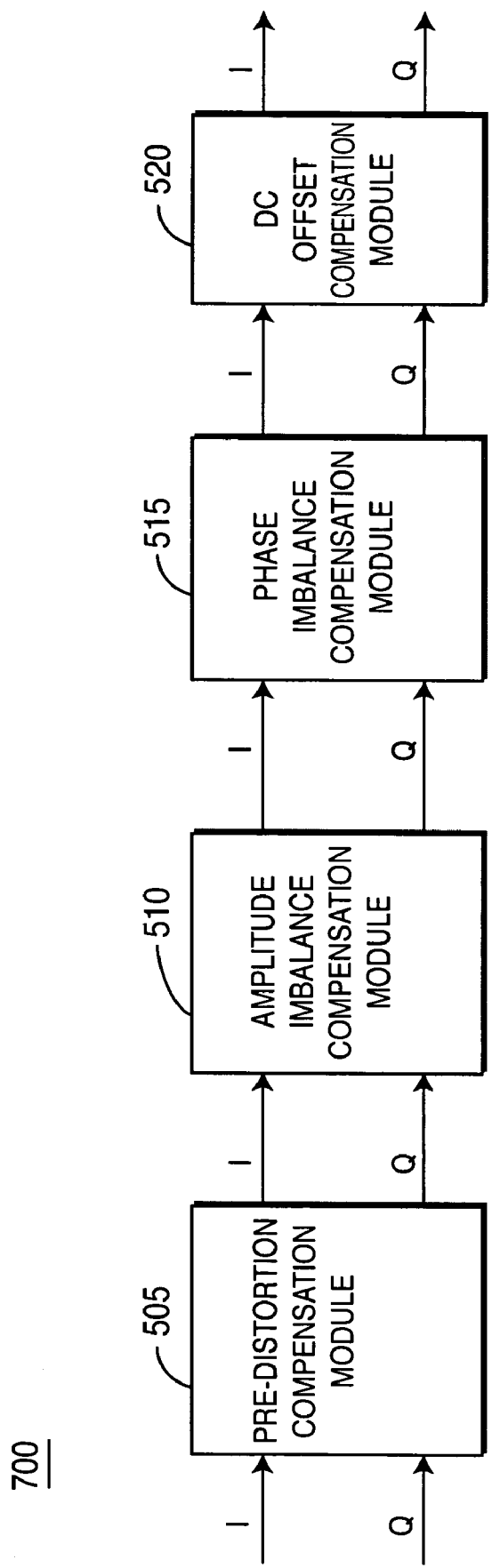
FIG. 7 shows a preferred configuration of the transmitter DBB compensation modules of FIG. 5.

The compensation modules included in both the receiver DBB compensation processor 125 and the transmitter DBB compensation processor 425 may designed according to numerous configurations. It is anticipated that the normalization compensation module 315 would be needed in each receiver DBB compensation configuration, whereas other compensation modules are considered to be optional, depending upon the deficiencies presented by the analog radio. FIG. 6 shows a preferred exemplary configuration 600 for the modules of the receiver DBB compensation processor 125, while FIG. 7 shows a preferred exemplary configuration 700 for the modules of the transmitter DBB compensation processor 425.

Upon powering up the FSA transceiver (i.e., WTRU), it is envisioned that all of the compensation modules would be implemented to optimize the parameters of the analog radio receiver 105 and analog radio transmitter 445 prior to commencing communications. After the commencement of communications, selective ones of the compensation modules may be configured to run on a periodic or continuous basis, or in response to a particular event or user request. For example, if the temperature sensor 475 in the analog radio transmitter 445 detects a rise in temperature of five degrees, activation of one or more of the compensation modules 505, 510, 515, 520 may be desired.

The FSA, with the advantageous use of the ADGC, provides DBB impairment compensation for both transmission and reception, RF selectivity enhancement by the radio resource control (RRC), DC offset correction, crosstalk compensation, HPF compensation, and advance frequency synthesis and modulation. The inventive FSA is capable of achieving an instantaneous dynamic range of 70 dB without any adjustments. Additionally, by using the AGDC an additional 20 dB could be obtained by switching the LNA on or off. One significant problem in wideband TDD (WTDD), generalized package radio service (GPRS), enhanced data rate for global system for mobile communications evolution (EDGE), high speed downlink packet access (HSDPA) is the ability to support large instantaneous power variation, which is easily obtained by the present invention. Furthermore, ADGC can be implemented without any knowledge about the timing of the signal, which is very important in cell search, cold acquisition, and initial frequency correction mode. It is also noted that ADGC as per the present invention provides compensation for fast fading without distorting the signal envelope.

AGDC offers cost benefits by virtue of its simplicity, and does not require any gain control in the radio. ADGC also being an open loop in its nature, introduces neither stability problems nor any overshoot, with no setting time. Most importantly, FSA paves the way for a software defined radio with pronounced advantages.

While this invention has been particularly shown and described with reference to preferred embodiments, it will be understood by those skilled in the art that various changes in form and details may be made therein without departing from the scope of the invention described hereinabove.

What is claimed is:

1. A wireless transmit/receive unit (WTRU) comprising:
    (a) a radio receiver comprising a plurality of analog receiver components;
    (b) a radio transmitter comprising a plurality of analog transmitter components;
    (c) at least one controller;
    (d) a plurality of compensation modules in communication with the controller, the modules for correcting radio frequency (RF) parameter deficiencies that exist in at least one of the radio receiver and the radio transmitter, whereby RF parameter requirements established for one or more of the analog receiver and transmitter components are relaxed;
    (e) at least one digital gain control circuit in communication with the radio receiver, wherein the digital gain control circuit enhances dynamic range of the radio receiver and compensates for channel loss variation, the digital gain control circuit comprising:
        (i) at least one logarithmic amplifier for compressing the dynamic range of analog signals received from the radio receiver to adjust the dynamic range of the analog signals;
        (ii) at least one analog to digital converter (ADC) in communication with the logarithmic amplifier, the ADC for digitizing an output of the logarithmic amplifier; and
        (iii) at least one look up table (LUT) in communication with the ADC, wherein the LUT provides anti-logarithmic functionality in order to decipher the digital domain output by the ADC; and
    (f) at least one low pass filter (LPF) in communication with the digital gain control circuit and at least one of the compensation modules, wherein the analog receiver components are introduced to a digital domain established to enhance the performance characteristics of the radio receiver.

2. A wireless communications system comprising:
    (a) a radio receiver comprising a plurality of analog receiver components;
    (b) a radio transmitter comprising a plurality of analog transmitter components;
    (c) at least one digital baseband (DBB) compensation processor including a plurality of radio frequency (RF) compensation modules for correcting RF parameter deficiencies that exist in at least one of the radio receiver and the radio transmitter, whereby RF parameter requirements established for one or more of the analog receiver and transmitter components are relaxed;
    (d) at least one digital gain control circuit in communication with the radio receiver, wherein the digital gain control circuit enhances dynamic range of the radio receiver and compensates for channel loss variation, the digital gain control circuit comprising:
        (i) at least one logarithmic amplifier for compressing the dynamic range of analog signals received from the radio receiver to adjust the dynamic range of the analog signals;
        (ii) at least one analog to digital converter (ADC) in communication with the logarithmic amplifier, the ADC for digitizing an output of the logarithmic amplifier; and
        (iii) at least one look up table (LUT) in communication with the ADC, wherein the LUT provides anti-logarithmic functionality in order to decipher the digital domain output by the ADC; and (e) at least one low pass filter (LPF) in communication with the digital gain control circuit and at least one of the compensation modules, wherein the analog receiver components are introduced to a digital domain established to enhance the performance characteristics of the radio receiver.

3. An integrated circuit (IC) for use in a wireless communication system including a radio receiver comprising a plurality of analog receiver components, and a radio transmitter comprising a plurality of analog transmitter components, the IC comprising:

(a) at least one controller;

(b) a plurality of compensation modules in communication with the controller, the modules for correcting radio frequency (RF) parameter deficiencies that exist in at least one of the radio receiver and the radio transmitter, whereby RF parameter requirements established for one or more of the analog receiver and transmitter components are relaxed;

(c) at least one digital gain control circuit in communication with the radio receiver, wherein the digital gain control circuit enhances dynamic range of the radio receiver and compensates for channel loss variation, the digital gain control circuit comprising:

(i) at least one logarithmic amplifier for compressing the dynamic range of analog signals received from the radio receiver to adjust the dynamic range of the analog signals;

(ii) at least one analog to digital converter (ADC) in communication with the logarithmic amplifier, the ADC for digitizing an output of the logarithmic amplifier; and (iii) at least one look up table (LUT) in communication with the ADC, wherein the LUT provides anti-logarithmic functionality in order to decipher the digital domain output by the ADC; and (d) at least one low pass filter (LPF) in communication with the digital gain control circuit and at least one of the compensation modules, wherein the analog receiver components are introduced to a digital domain established to enhance the performance characteristics of the radio receiver.

* * * * *

UNITED STATES PATENT AND TRADEMARK OFFICE
CERTIFICATE OF CORRECTION

PATENT NO.       : 7,257,379 B2  
APPLICATION NO.  : 10/713613  
DATED            : August 14, 2007  
INVENTOR(S)      : Ozluturk et al.

It is certified that error appears in the above-identified patent and that said Letters Patent is hereby corrected as shown below:

At column 2, line 17, after the word "invention", delete "and".

At column 3, line 47, before the word "provided", delete "220A, 220B" and insert therefor --230A, 230B--.

At column 3, lines 50-51, after the words "sign bits", delete "220A, 220B" and insert therefor --230A, 230B--.

At column 6, line 63, before the word "increase", delete "db" and insert therefor --dB--.

At column 7, line 15, before the word "designed", insert --be--.

At column 7, line 45, after the words "using the", delete "AGDC" and insert therefor --ADGC--.

At column 7, line 59, before the word "offers", delete "AGDC" and insert therefor --ADGC--.

Signed and Sealed this

Eighteenth Day of December, 2007

JON W. DUDAS  
*Director of the United States Patent and Trademark Office*